: US 10,950,613 B2
(45) Date of Patent: Mar. 16, 2021

(12) United States Patent
Lee

(10) Patent No.

(54) SEMICONDUCTOR DEVICE AND A METHOD OF MANUFACTURING A SEMICONDUCTOR DEVICE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/678,713

(22) Filed: Nov. 8, 2019

(65) Prior Publication Data

US 2021/0013222 A1 Jan. 14, 2021

(30) Foreign Application Priority Data

Jul. 8, 2019 (KR) .................. 10-2019-0082271

(51) Int. Cl.
| | |
|---|---|
| *H01L 27/115* | (2017.01) |
| *H01L 27/11556* | (2017.01) |
| *H01L 27/11582* | (2017.01) |
| *H01L 21/324* | (2006.01) |
| *H01L 21/225* | (2006.01) |
| *H01L 27/24* | (2006.01) |
| H01L 27/11578 | (2017.01) |

(52) U.S. Cl.
CPC .... *H01L 27/11556* (2013.01); *H01L 21/2251* (2013.01); *H01L 21/324* (2013.01); *H01L 27/11582* (2013.01); *H01L 27/249* (2013.01); H01L 27/11578 (2013.01)

(58) Field of Classification Search
CPC ................................................ H01L 27/11578
See application file for complete search history.

(56) References Cited

U.S. PATENT DOCUMENTS

| | | | | | |
|---|---|---|---|---|---|
| 2013/0320424 | A1* | 12/2013 | Lee | ...................... | H01L 29/7926 257/314 |
| 2015/0318301 | A1* | 11/2015 | Lee | ...................... | H01L 29/7926 257/324 |
| 2016/0071868 | A1* | 3/2016 | Arai | ...................... | H01L 23/528 257/325 |
| 2016/0372481 | A1* | 12/2016 | Izumida | ............ | H01L 27/11582 |
| 2017/0243651 | A1* | 8/2017 | Choi | ................... | H01L 27/1157 |
| 2017/0309636 | A1* | 10/2017 | Lee | ..................... | H01L 27/0688 |
| 2018/0130814 | A1* | 5/2018 | Lee | ................... | H01L 27/11568 |

(Continued)

FOREIGN PATENT DOCUMENTS

| | | |
|---|---|---|
| KR | 1020170065290 A | 6/2017 |
| KR | 1020170098616 A | 8/2017 |

*Primary Examiner* — George R Fourson, III
(74) *Attorney, Agent, or Firm* — William Park & Associates Ltd.

(57) ABSTRACT

A method of manufacturing a semiconductor device according to an embodiment of the present disclosure may include forming a first sacrificial layer including a first portion and a second portion having a thickness thicker than a thickness of the first portion, forming a stack including first material layers and second material layers alternating with each other on the first sacrificial layer, forming a channel structure passing through the stack and extending to the first portion, forming a slit passing through the stack and extending to the second portion, removing the first sacrificial layer through the slit to form a first opening, and forming a second source layer connected to the channel structure in the first opening.

16 Claims, 16 Drawing Sheets

(56) References Cited

U.S. PATENT DOCUMENTS

| | | | | |
|---|---|---|---|---|
| 2019/0115362 A1* | 4/2019 | Choi | ................. | H01L 27/11582 |
| 2019/0172906 A1* | 6/2019 | Kim | ................. | H01L 27/11582 |
| 2020/0051997 A1* | 2/2020 | Park | ................. | H01L 29/41741 |
| 2020/0066751 A1* | 2/2020 | Yoshimizu | ........ | H01L 29/66833 |
| 2020/0075621 A1* | 3/2020 | Nakaki | ............ | H01L 27/11582 |

* cited by examiner

SEMICONDUCTOR DEVICE AND A METHOD OF MANUFACTURING A SEMICONDUCTOR DEVICE

CROSS-REFERENCE TO RELATED APPLICATION

The present application claims priority under 35 U.S.C. § 119(a) to Korean patent application number 10-2019-0082271, filed on Jul. 8, 2019, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the semiconductor device.

2. Related Art

A non-volatile memory element is a memory element in which stored data is maintained even when a supply of power is cut off. Recently, as a degree of integration of two-dimensional non-volatile memory elements that form memory cells in a single layer on a substrate has reached a limit, three-dimensional non-volatile memory elements that vertically stack memory cells on a substrate have been proposed.

The three-dimensional non-volatile memory elements include interlayer insulating layers and gate electrodes which are alternately stacked, and channel layers passing through the interlayer insulating layers and the gate electrodes, and memory cells are stacked along the channel layers. Various structures and manufacturing methods have been developed to improve operation reliability of the non-volatile memory element having such a three-dimensional structure.

SUMMARY

An embodiment of the present disclosure provides a semiconductor device having a stable structure and an improved characteristic. The present disclosure also provides a method of manufacturing the semiconductor device.

A method of manufacturing a semiconductor device according to an embodiment of the present disclosure may include forming a first sacrificial layer including a first portion and a second portion having a thickness thicker than a thickness of the first portion, forming a stack including first material layers and second material layers alternating with each other on the first sacrificial layer, forming a channel structure passing through the stack and extending to the first portion, forming a slit passing through the stack and extending to the second portion, removing the first sacrificial layer through the slit to form a first opening, and forming a second source layer connected to the channel structure in the first opening.

A method of manufacturing a semiconductor device according to an embodiment of the present disclosure may include forming a first source layer and forming a first opening in the first source layer. The method may further include forming, on the first source layer, a first sacrificial layer including a first portion and a second portion, wherein the second portion is formed in the first opening. The method may additionally include forming a stack including sacrificial layers and insulating layers alternating with each other on the first sacrificial layer, forming a channel structure passing through the stack and having a bottom surface positioned in the first source layer, forming a slit passing through the stack and having a bottom surface positioned in the second portion, removing the first sacrificial layer through the slit to form a second opening, and forming a second source layer connected to the channel structure in the second opening.

A semiconductor device according to an embodiment of the present disclosure may include a first source layer including a first portion and a second portion having a thickness thicker than a thickness of the first portion, bit lines, a stack positioned between the first source layer and the bit lines, wherein the stack includes conductive layers and insulating layers alternating with each other. The semiconductor device may also include a channel structure passing through the stack and extending to the first portion, and a slit passing through the stack and extending to the second portion.

A semiconductor device having a stable structure and improved reliability may be provided. In addition, in manufacturing the semiconductor device, a degree of difficulty of a process may be reduced, a procedure may be simplified, and cost may be reduced.

DETAILED DESCRIPTION

Figure 1A:
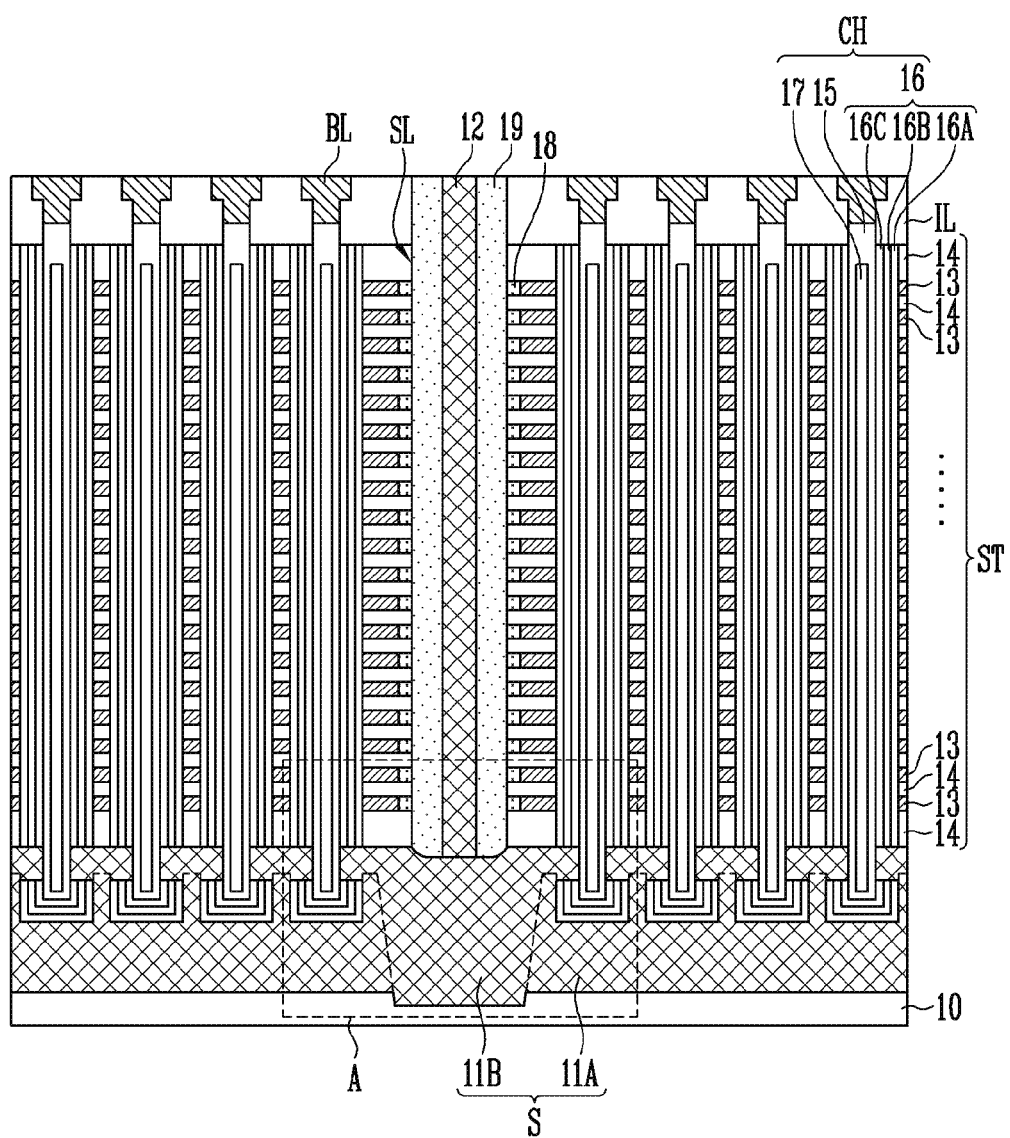
FIGS. 1A to 1C are cross-sectional views illustrating a structure of a semiconductor device according to an embodiment of the present disclosure.

Hereinafter, embodiments of the present disclosure are described. In the drawings, thickness and distance are expressed for convenience of description, and may be exaggerated relative to the actual physical thickness. In describing the present disclosure, known configurations irrespective of the gist of the present disclosure may be omitted. It should be noted that in adding reference numerals to the components of each drawing, the same components have the same number when possible, even though the same components are shown in different drawings.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes a component, the case means that the portion may further include other components without excluding other components unless specifically stated otherwise.

Figure 1B:
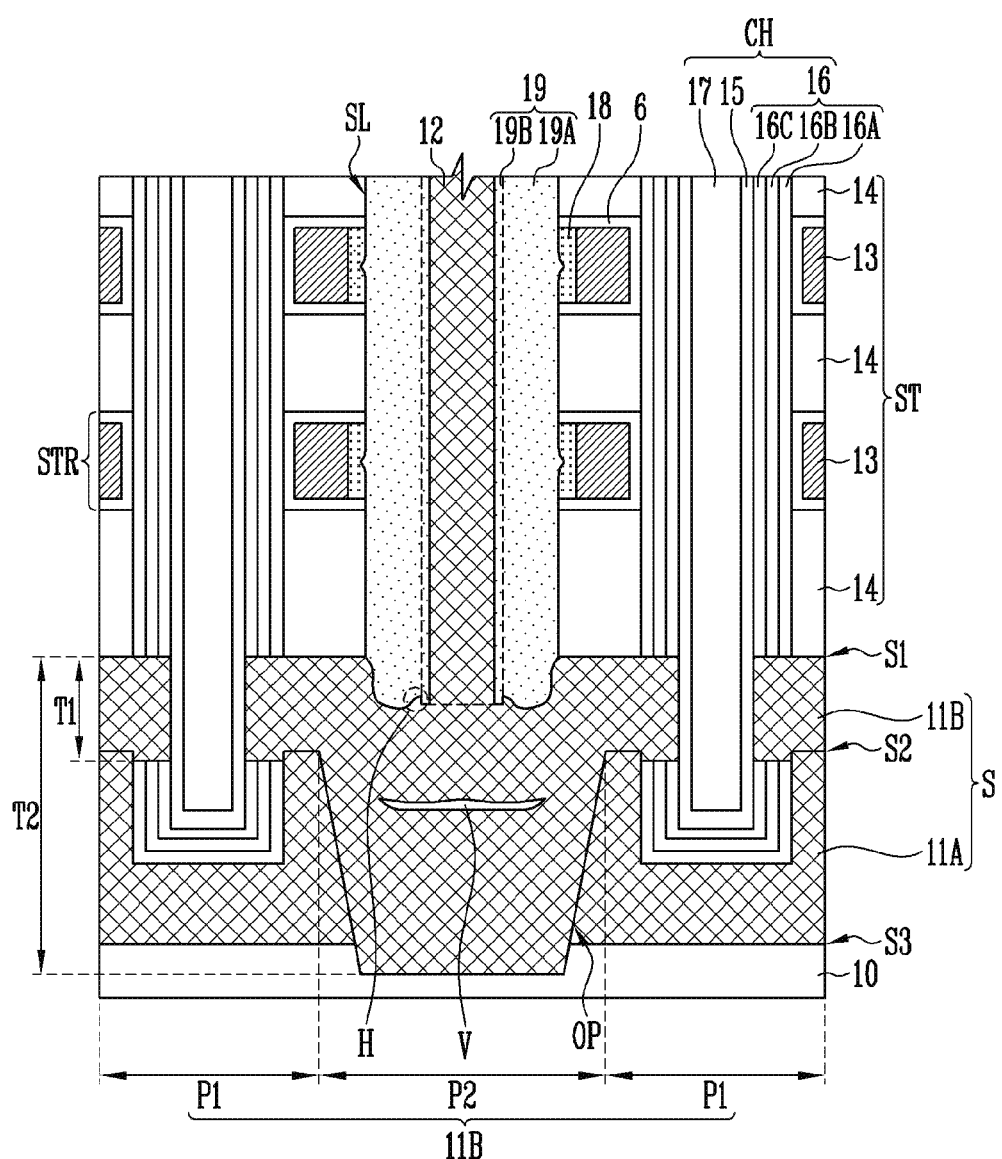
Figure 1C:
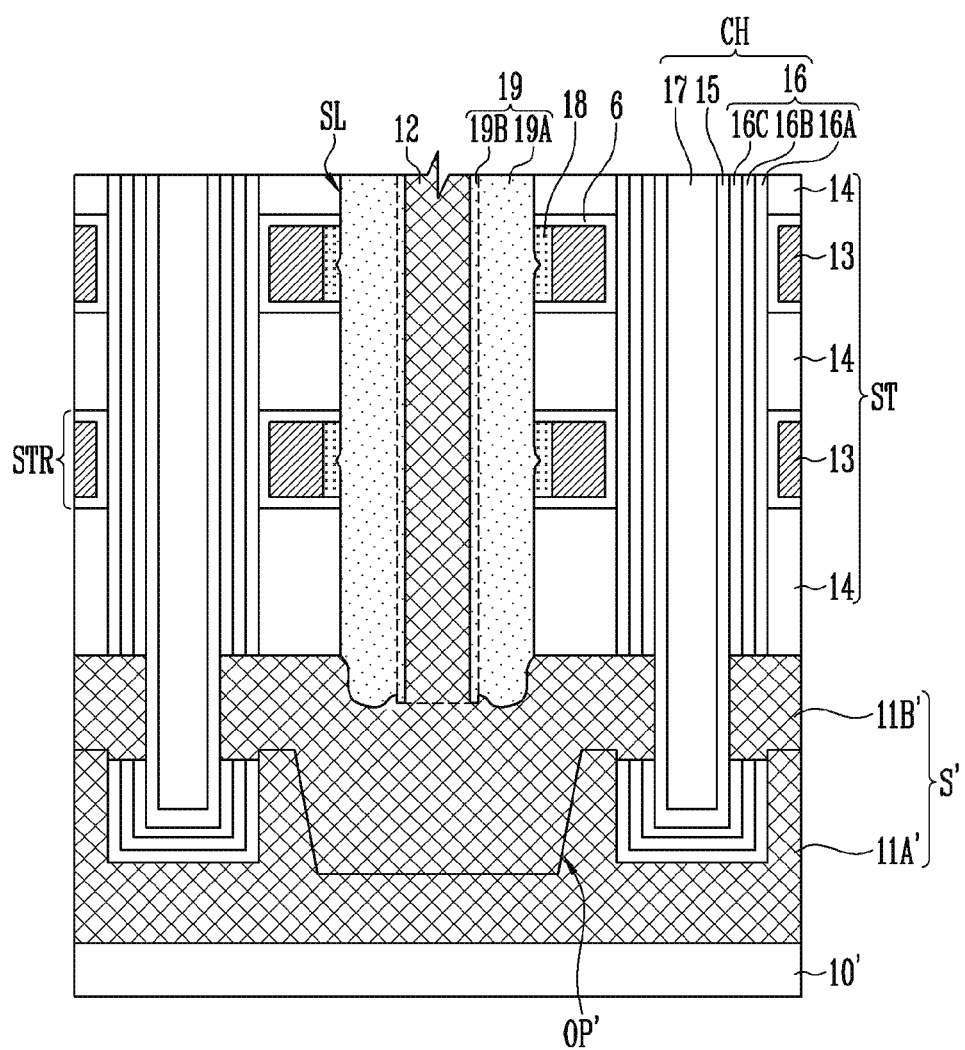

FIGS. 1A to 1C are cross-sectional views illustrating a structure of a semiconductor device according to an embodiment of the present disclosure. FIGS. 1B and 1C are enlarged views of a region A of FIG. 1A.

Referring to FIG. 1A, the semiconductor device may include a source structure S, a stack ST, a channel structure CH, a slit SL, and bit lines BL. In addition, the semiconductor device may further include at least one of a source contact structure 12, a sealing layer 18, a spacer 19, and an interlayer insulating layer IL.

The source structure S may be a conductive layer including polysilicon, metal, or the like, and may be a single layer or a multi-layer. The source structure S may be positioned between a base 10 and the stack ST. The base 10 may be a semiconductor substrate, an insulating layer, or the like.

The source structure S may include a first source layer 11A and a second source layer 11B. The first source layer 11A may be positioned adjacent to the base 10, and the second source layer 11B may be positioned adjacent to the stack ST.

The stack ST may be positioned between the source structure S and the bit lines BL. The stack ST may include conductive layers 13 and insulating layers 14 which are alternately stacked. The conductive layers 13 may be selection lines, word lines, and the like. The insulating layers 14 may insulate the stacked conductive layers 13 from each other and may include an insulating material such as an oxide or a nitride.

The channel structure CH is connected between the bit lines BL and the source structure S. The channel structure CH may pass through the stack ST and extend to the source structure S. The channel structure CH may include a channel layer 15 and may further include at least one of a memory layer 16 and a gap fill layer 17. The channel layer 15 may include a semiconductor material such as silicon (Si) or germanium (Ge). The memory layer 16 may be formed to surround a sidewall of the channel layer 15. The memory layer 16 may include at least one of a charge blocking layer 16A, a data storage layer 16B, and a tunnel insulating layer 16C. The data storage layer 16B may include a floating gate, a charge trap material, polysilicon, nitride, a variable resistance material, a phase change material, a nanodot, or the like. The gap fill layer 17 may be formed in the channel layer 15. The gap fill layer 17 may include an oxide layer.

A select transistor or a memory cell may be positioned in a region where the channel structure CH and the conductive layers 13 intersect. The select transistor and the memory cell sharing one channel layer 15 may configure one memory string. The memory string may include at least one drain select transistor, a plurality of memory cells, and at least one source select transistor connected in series.

The source contact structure 12 may pass through the stack ST and may be connected to the source structure S. The source contact structure 12 may be a conductive layer including polysilicon, metal, or the like. The source contact structure 12 may be a single layer or a multi-layer.

The spacer 19 may be interposed between the source contact structure 12 and the stack ST. The spacer 19 may be formed on an inner wall of the slit SL and may be formed to surround a sidewall of the source contact structure 12. The spacer 19 may include an insulating layer and may be a single layer or a multi-layer.

The sealing layers 18 may be positioned at the same level as the conductive layers 13, and may be interposed between the stacked insulating layers 14. The sealing layers 18 may be interposed between the conductive layers 13 and the spacers 19. The sealing layers 18 may include a nitride layer.

Referring to FIG. 1B, the source structure S may include a first surface S1 adjacent to the stack ST and a third surface S3 adjacent to the base 10. The third surface S3 may oppose the first surface S1. The first surface S1 may be spaced from the base 10. The third surface S3 may be spaced apart from the stack ST. The third surface S3 may include a protrusion portion protruding toward the base 10 in a region corresponding to the slit SL.

The first source layer 11A may include an opening OP and may be interposed between the base 10 and the second source layer 11B. The first source layer 11A may include a conductive layer such as a polysilicon layer, and may include a dopant of an N type or P type. For example, when an erase operation is performed using a gate induced leakage (GIDL) method, the first source layer 11A may include an N type impurity such as phosphorus Ph.

The second source layer 11B may be interposed between the first source layer 11A and the stack ST. The first source layer 11A may be adjacent to the second source layer 11B opposite the stack ST. The second source layer 11B may include a first portion P1 and a second portion P2. The first portion P1 may have a plate shape extending in a horizontal direction. Here, the horizontal direction may be a direction parallel to a surface of the base 10. The second portion P2 may be connected to the first portion P1 and may be formed in the opening OP of the first source layer 11A. The second portion P2 may pass through the first source layer 11A and extend to the base 10.

The first portion P1 and the second portion P2 may have different thicknesses. Appropriate thicknesses of the first portion P1 and the second portion P2 may be determined in consideration of a manufacturing method, a final structure, a driving characteristic, and the like. For example, the first portion P1 may have a relatively thin thickness T1 in order to stably support the stack ST in a process of replacing the sacrificial layer with the second source layer 11B. In addition, the first portion P1 may have a relatively thin thickness T1 so that the channel structures CH and the source structure S may be stably connected to each other without a void. On the contrary, the second portion P2 may have a relatively thick thickness T2, as the second portion P2 is used as an etch stop layer at the time of forming the slit SL. Therefore, while maintaining the overall thickness of the source structure S, the thickness of each region of the second source layer 11B may be adjusted according to a shape of the first source layer 11A. The first portion P1 may have a thickness T1 which is thinner than a thickness T2 of the second portion P2. For example, an upper surface of the first portion P1 and an upper surface of the second portion P2 may be positioned at substantially the same level, and a lower surface of the first portion P1 and a lower surface of the second portion P2 may be positioned at different levels.

The second source layer 11B may include a first surface S1 adjacent to the stack ST and a second surface S2 adjacent to the first source layer 11A. The second surface S2 may oppose the first surface S1. A portion of the second surface S2 corresponding to the second portion P2 may protrude in comparison with a portion of the second surface S2 corresponding to the first portion P1. In addition, the second portion P2 may protrude into the base 10 through the first source layer 11A.

The second source layer 11B may be in direct contact with the channel layer 15. The memory layer 16 may partially surround the sidewall of the channel layer 15 and a region of the channel layer 15 exposed by the memory layer 16 may be in direct contact with the second source layer 11B. The memory layer 16 might not be interposed between the channel layer 15 and the second source layer 11B.

The second source layer 11B may be a single layer with the source contact structure 12. In other words, an interface might not exist between the source contact structure 12 and the second source layer 11B. The first source layer 11A and the second source layer 11B may be layers formed by separate processes. An interface may exist between the first source layer 11A and the second source layer 11B.

The second source layer 11B might not include a void V therein. Even though the second source layer 11B is shown to include the void V, a position of the void V may be limited to the second portion P2. Because the first portion P1 has the thickness (T1<T2) thinner than that of the second portion P2, the void V might not exist in the first portion P1. Here, the void V may be an empty space in which the conductive material is not filled.

The spacer 19 may be a multi-layer including a first spacer 19A and a second spacer 19B. The first spacer 19A and the second spacer 19B may include materials having different etching rates. For example, the first spacer 19A may include an oxide layer and the second spacer 19B may include a nitride layer. The second spacer 19B may have a thickness thinner than the thickness of the first spacer 19A. The second spacer 19B may be interposed between the first spacer 19A and the source contact structure 12.

The spacer 19 may have a bend on a lower surface. The spacer 19 may include a groove between the first spacer 19A and the second spacer 19B, and the second source layer 11B may protrude into the groove. For example, the second source layer 11B may include a horn H protruding between the first spacer 19A and the second spacer 19B.

The semiconductor device may further include memory layers 6. The memory layers 6 may be interposed between the conductive layers 13 and the insulating layers 14 and between the conductive layers 13 and the channel structure CH. Each of the memory layers 6 may have a cross section of a "C" shape and may be formed to surround the conductive layer 13 and the sealing layer 18.

Referring to FIG. 1C, a source structure S' may include a first source layer 11A' and a second source layer 11B'. An opening OP' of the first source layer 11A' may have a depth shallower than the depth of the opening OP of the embodiment described with reference to FIG. 1B. The opening OP' of FIG. 1C may partially pass through the first source layer 11A' whereas the opening OP of FIG. 1B is shown to completely passes through the first source layer 11A. In this case, the second portion P2 may protrude into the first source layer 11A', but might not extend all the way to a base 10'.

According to the structure as described above, the source structure S or S' may have a uniform thickness, the first portion P1 and the second portion P2 of the second source layer 11B or 11B' may have different thicknesses. Therefore, structure stability and an operation characteristic of the semiconductor device may be improved.

FIGS. 2A to 2L are cross-sectional views for describing a method of manufacturing a semiconductor device according to an embodiment of the present disclosure. FIGS. 2E to 2L illustrate a cross section according to a subsequent process by enlarging a B region of FIG. 2D. Descriptions for features already described above are omitted below.

Figure 2A:
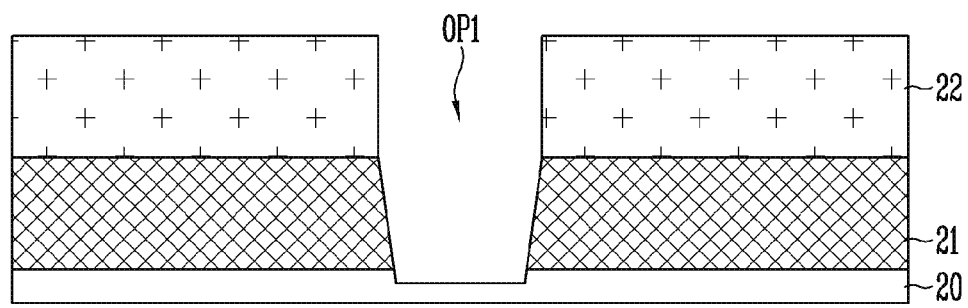
FIGS. 2A to 2L are cross-sectional views for describing a method of manufacturing a semiconductor device according to an embodiment of the present disclosure.

Referring to FIG. 2A, a first source layer 21 is formed on a base 20. The first source layer 21 may include a polysilicon layer. The first source layer 21 may include an N-type or P-type impurity.

Subsequently, the first source layer 21 is patterned. After forming a mask pattern 22 on the first source layer 21, the first source layer 21 may be etched using the mask pattern 22. Therefore, a first opening OP1 is formed. The first opening OP1 may be positioned corresponding to a position where a slit is to be formed in a subsequent process (refer to FIG. 2D).

Figure 2B:
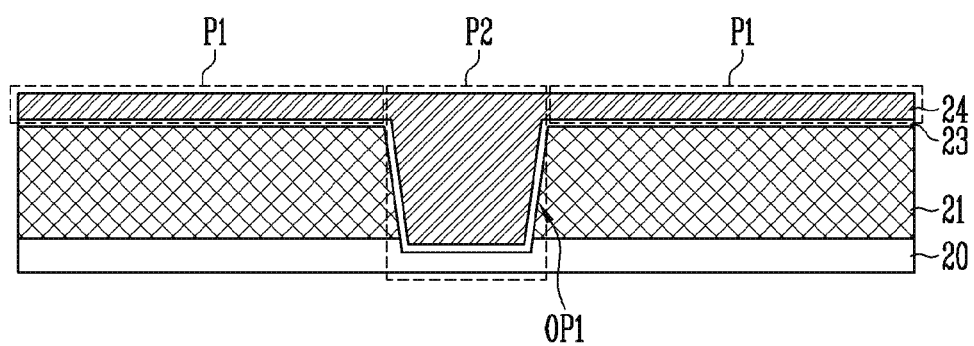

Referring to FIG. 2B, after removing the mask pattern 22, a first sacrificial layer 23 is formed on the first source layer 21. The first sacrificial layer 23 may be formed along a profile of the first source layer 21 including the first opening OP1. The first sacrificial layer 23 may be formed at a thickness that does not completely fill the first opening OP1. The first sacrificial layer 23 may include an oxide layer.

Subsequently, a second sacrificial layer 24 is formed on the first sacrificial layer 23. For example, after forming a second sacrificial material on the first sacrificial layer 23, the second sacrificial material is etched back to form the second sacrificial layer 24. The second sacrificial layer 24 may include a first portion P1 and a second portion P2. The second sacrificial layer 24 may include a polysilicon layer.

The second sacrificial layer 24 is for securing a space where the second source layer is to be formed in a subsequent process. The first portion P1 corresponds to a position at which channel structures are to be formed in the subsequent process, and the second portion P2 corresponds to a position at which the slit is to be formed in the subsequent process (refer to FIG. 2C). Therefore, in order to stably perform the subsequent process, the first portion P1 has a thin thickness and the second portion P2 has a relatively thick thickness.

After patterning the first source layer 21, the second sacrificial layer 24 is formed to form the second sacrificial layer 24 having a different thickness according to a region. Because the second portion P2 is formed in the first opening OP1, the second portion P2 may have a thickness thicker than the thickness of the first portion P1.

Figure 2C:
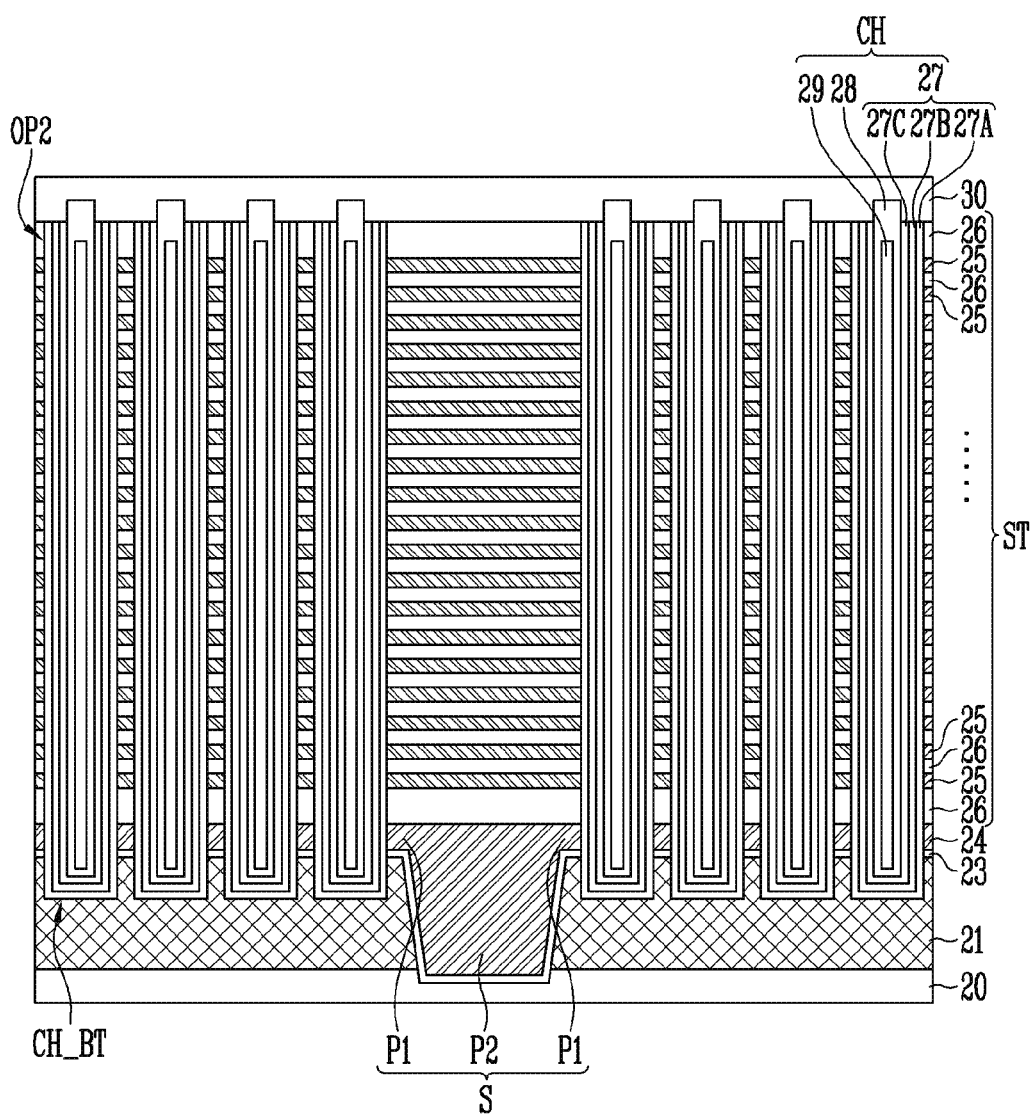

Referring to FIG. 2C, a stack ST is formed on the second sacrificial layer 24. The stack ST may include first material layers 25 and second material layers 26 that are alternately stacked. The first material layers 25 may be for forming a gate electrode of a memory cell, a select transistor, or the like, and the second material layers 26 may be for mutually insulating the stacked gate electrodes. The first material layers 25 are formed of a material of which an etching selectivity is high with respect to the second material layers 26. For example, the first material layers 25 may be sacrificial layers including nitride or the like, and the second material layers 26 may be insulating layers including an oxide or the like. As another example, the first material layers 25 may be conductive layers including polysilicon, tungsten, or the like, and the second material layers 26 may be insulating layers including an oxide or the like.

Subsequently, the channel structures CH passing through the stack ST are formed. The channel structures CH may pass through the stack ST and may extend to the first portion P1 of the second sacrificial layer 24. In addition, the channel structures CH may pass through the first portion P1 and the first sacrificial layer 23 and may extend to the first source layer 21. Bottom surfaces CH_BT of the channel structures CH may be positioned in the first source layer 21.

A method of forming the channel structures CH is described as follows. First, second openings OP2 passing through the stack ST and extending to the first portion P1 are formed. Bottom surfaces of the second openings OP2 may be positioned in the first source layer 21. Subsequently, memory layers 27 are formed in the second openings OP2.

Each of the memory layers 27 may include at least one of a charge blocking layer 27A, a data storage layer 27B, and a tunnel insulating layer 27C. Subsequently, channel layers 28 are formed in the second openings OP2. The channel layers 28 may include gap fill layers 29. Subsequently, an interlayer insulating layer 30 is formed on the stack ST.

Figure 2D:
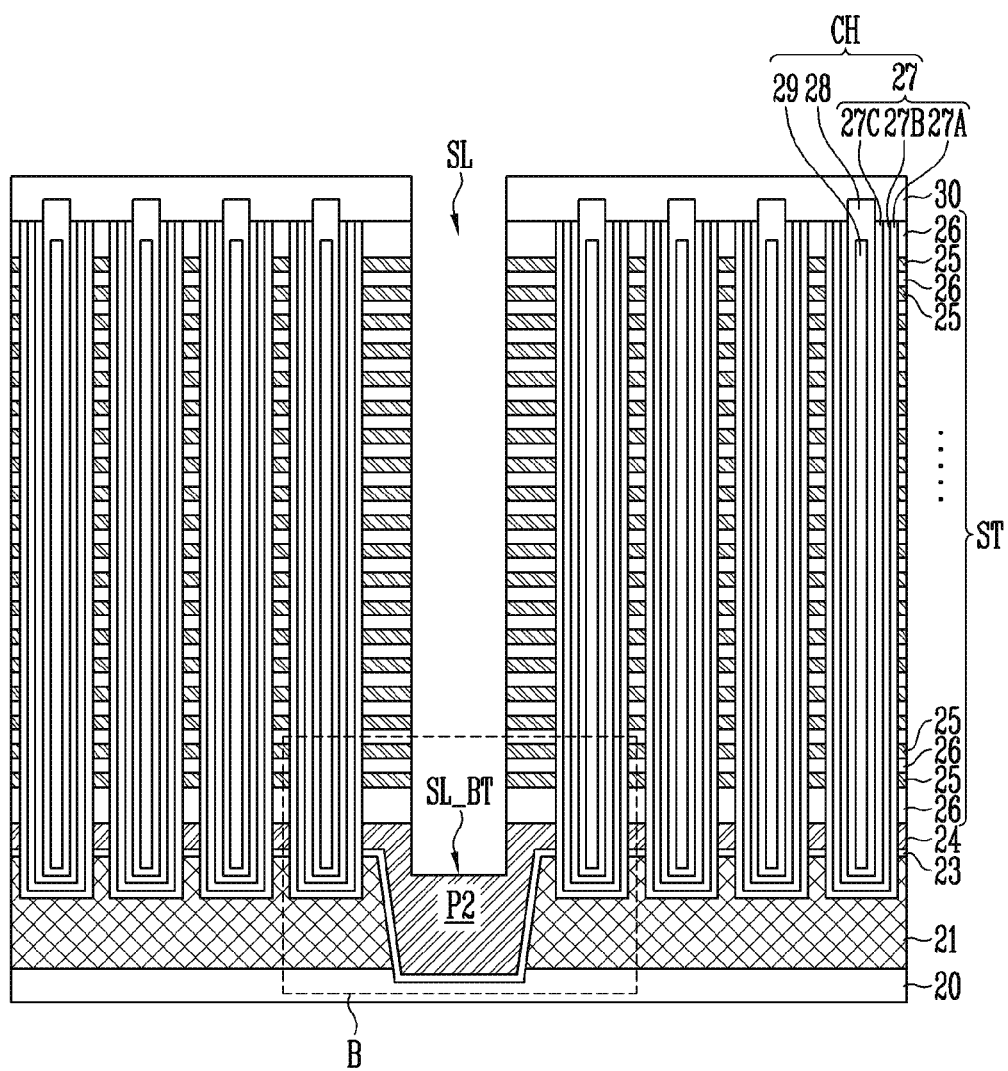

Referring to FIG. 2D, the slit SL is formed. The slit SL passes through the stack ST and extends to the second portion P2 of the second sacrificial layer 24. According to an embodiment of the present disclosure, because the second portion P2 has a thick thickness, the second sacrificial layer 24 may be used as an etch stop layer during an etching process for forming the slit SL. Therefore, the bottom surface SL_BT of the slit SL may be positioned in the second sacrificial layer 24. The slit SL might not completely pass through the second portion P2, and the bottom surface SL_BT of the slit SL may be positioned in the second portion P2.

Figure 2E:
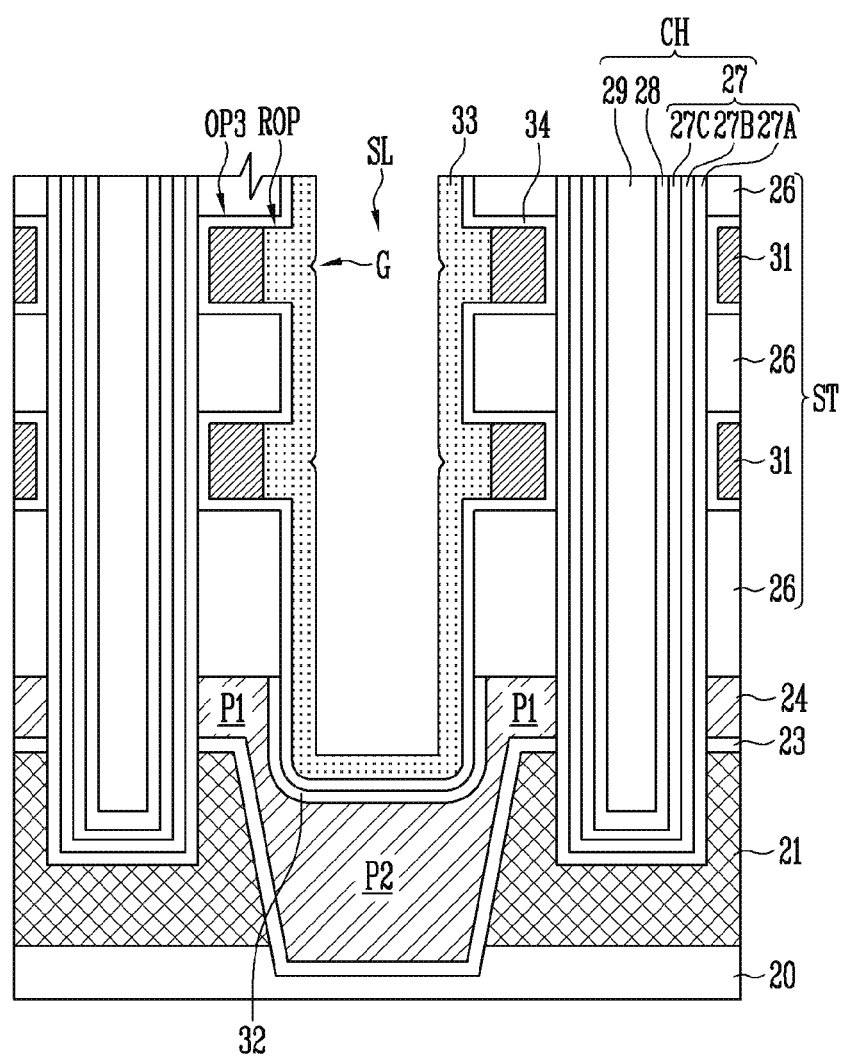

Referring to FIG. 2E, the first material layers 25 are replaced with third material layers 31 through the slit SL. As an embodiment, when the first material layers 25 are sacrificial layers and the second material layers 26 are insulating layers, the first material layers 25 are replaced with conductive layers. First, third openings OP3 are formed by removing the first material layers 25. Subsequently, after forming the conductive material in the slit SL and the third openings OP3, the conductive materials formed in the slit SL may be etched to form conductive layers (third material layers 31). At this time, the conductive material may be etched so that a region of the third openings OP3 adjacent to the slit SL is opened again. Therefore, the stacked conductive layers may be electrically separated. In addition, before forming the conductive layers, a memory layer 34 may be further formed in the third openings OP3. The memory layer 34 may include at least one of a charge blocking layer, a data storage layer, and a tunnel insulating layer. As another example, when the first material layers 25 are conductive layers and the second material layers 26 are insulating layers, the first material layers 25 may include silicide.

For reference, before replacing the first material layers 25 with the third material layers 31, a protective layer 32 may be formed on an exposed surface of the second sacrificial layer 24. The protective layer 32 may include an oxide layer and may be formed using an oxidation process. The protective layer 32 may be for protecting the second sacrificial layer 24 in the process of replacing the first material layers 25 with the third material layers 31. When the etching selectivity between the second sacrificial layer 24 and the first material layers 25 is high, the process of forming the protective layer 32 may be omitted. For example, when the first material layers 25 are nitride layers and the second sacrificial layer 24 is an un-doped polysilicon layer, the protective layer 32 is not formed. For example, when the first material layers 25 are nitride layers and the second sacrificial layer 24 is a doped polysilicon layer, the protective layer 32 is formed.

Subsequently, a sealing material 33 is formed in the slit SL. The sealing material 33 is for protecting the third material layers 31 in a subsequent process. The sealing material 33 may include a nitride layer. The sealing material 33 may be formed along a profile of the slit SL and may be formed to fill re-open regions ROP. Therefore, the sealing material 33 may include grooves G at positions corresponding to the re-open regions ROP.

Figure 2F:
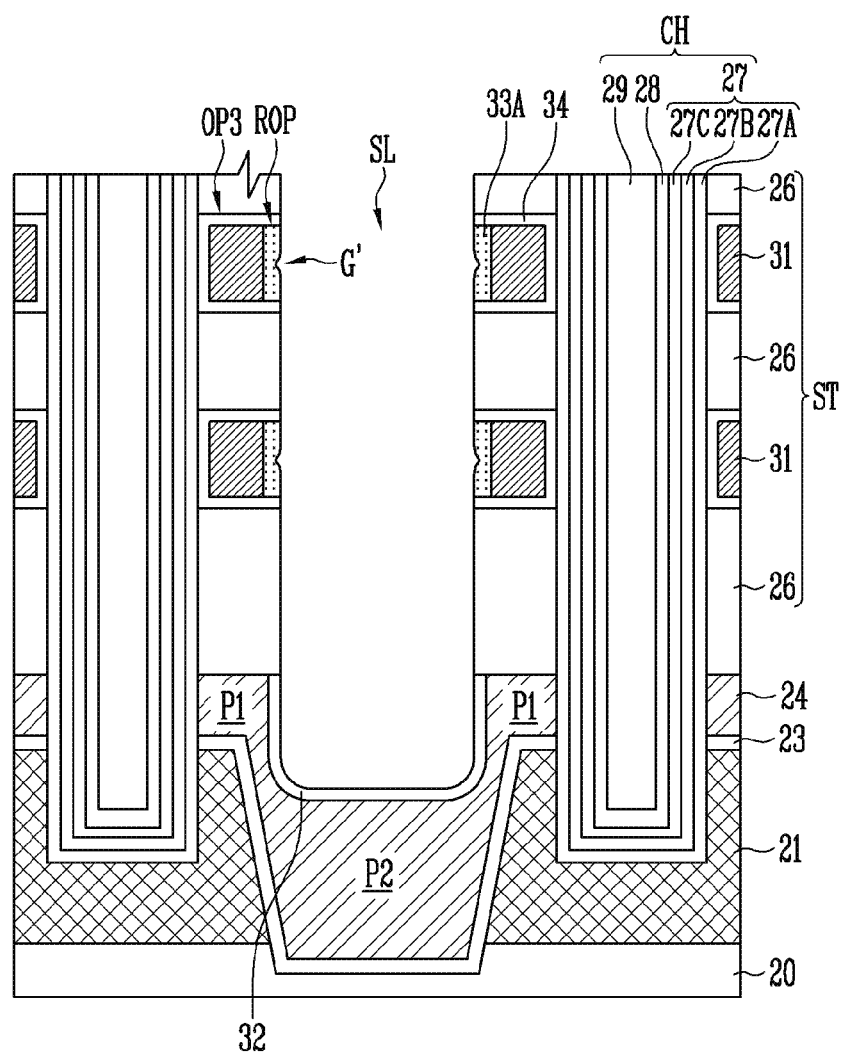

Referring to FIG. 2F, the sealing material 33 is etched to form sealing layers 33A. For example, the sealing material 33 formed in the slit SL is etched by using a wet etching process. Therefore, the sealing layers 33A respectively positioned in the re-opened regions (ROP) may be formed. In addition, each of the sealing layers 33A may include a groove G' on a surface thereof. The groove G' may be obtained by transcribing the groove G of the sealing material 33 during the etching process.

Subsequently, the memory layer 34 formed in the slit SL is etched. Therefore, the memory layer 34, the third material layer 31, and the sealing layer 33A may be formed in each of the third openings OP3.

Figure 2G:
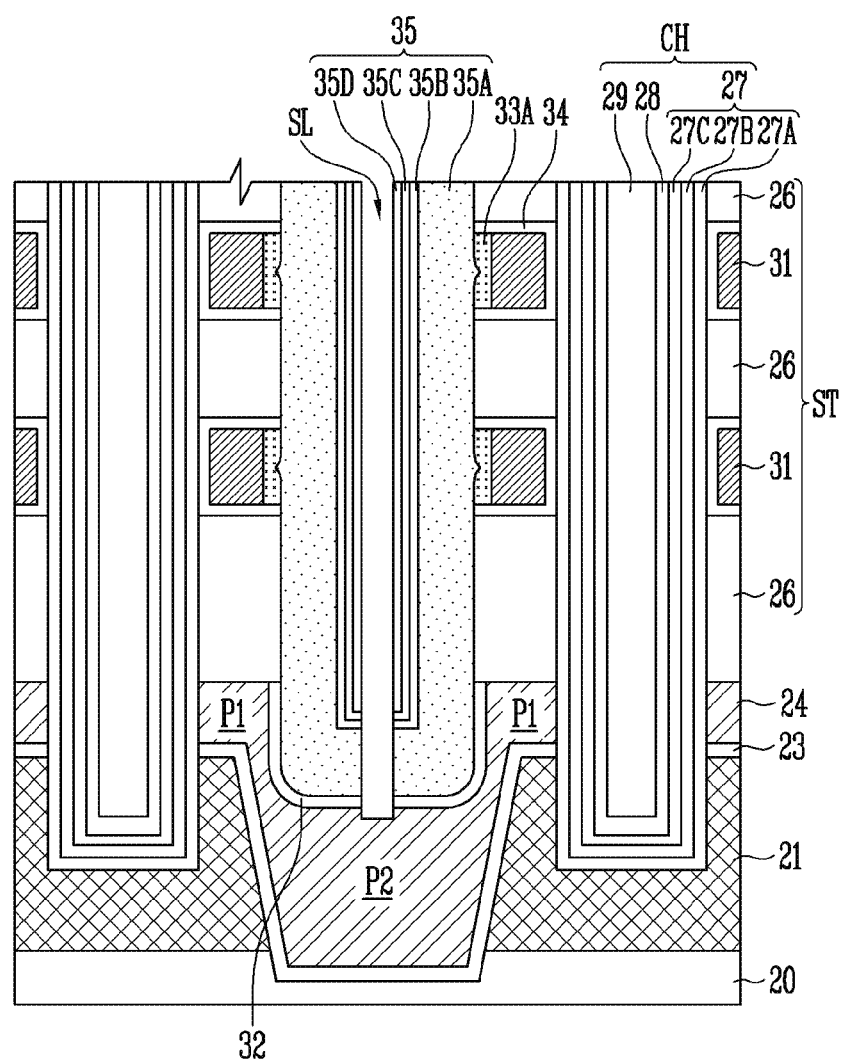

Referring to FIG. 2G, a spacer 35 is formed in the slit SL. For example, after forming a spacer material along the profile of the slit SL, the spacer material formed on the bottom surface of the slit SL is etched using an etch-back process. Therefore, the spacer 35 may be formed on an inner wall of the slit SL. At this time, the protective layer 32 may be etched and the second portion P2 of the second sacrificial layer 24 may be exposed.

The spacer 35 may be a multi-layer in which layers having different etching rates are alternately stacked. The spacer 35 may include a first spacer 35A, a second spacer 35B, a third spacer 35C, and a fourth spacer 35D. The second and fourth spacers 35B and 35D may be formed of a material having a high etching selectivity with respect to the first and third spacers 35A and 35C. The first and third spacers 35A and 35C may include an oxide layer and the second and fourth spacers 35B and 35D may include a nitride layer.

Figure 2H:
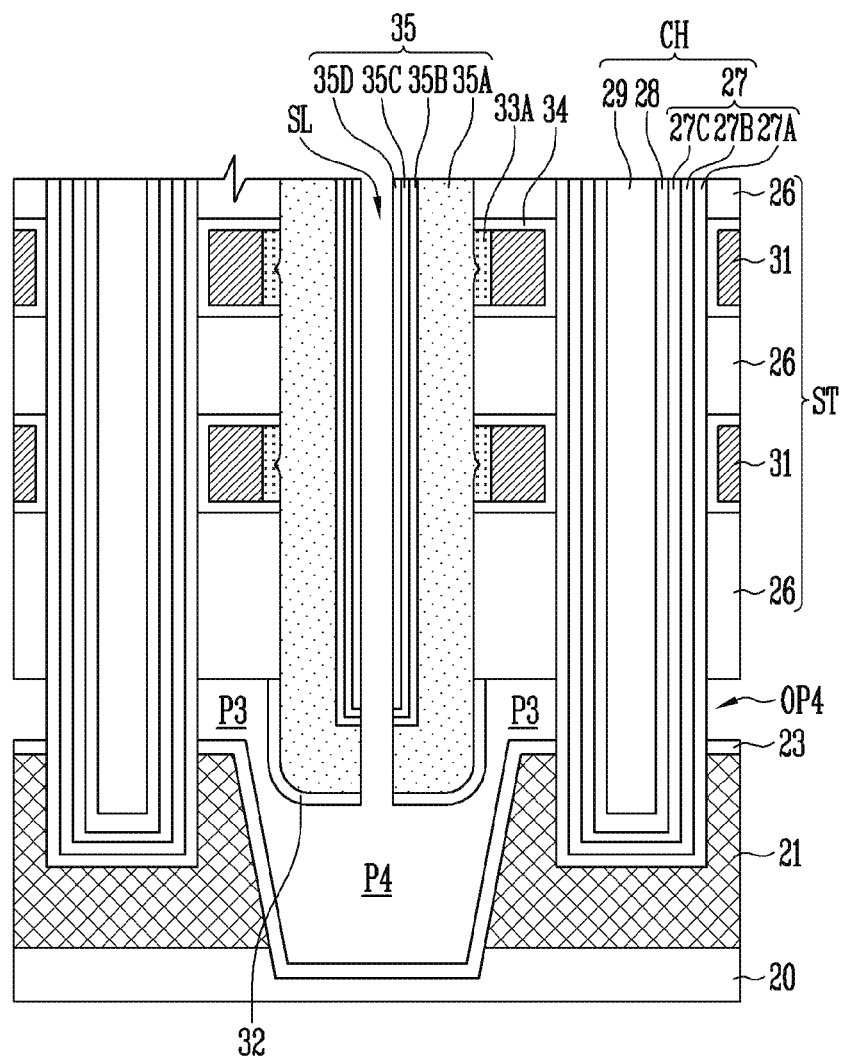

Referring to FIG. 2H, the second sacrificial layer 24 is removed through the slit SL to form a fourth opening OP4. For example, the second sacrificial layer 24 is removed using a dip out process. The fourth opening OP4 may include a third portion P3 from which the first portion P1 is removed and a fourth portion P4 from which the second portion P2 is removed. The first sacrificial layer 23 and the memory layer 27 may be exposed through the fourth opening OP4.

The stack ST is spaced apart from the first source layer by the fourth opening OP4. In addition, the channel structure CH supports the stack ST floating on the first source layer 21. Therefore, when a thickness of the third portion P3 is thick, there is difficulty in stably supporting the stack ST. According to an embodiment of the present disclosure, because the third portion P3 has a relatively thin thickness, the stack ST may be stably supported.

Figure 2I:
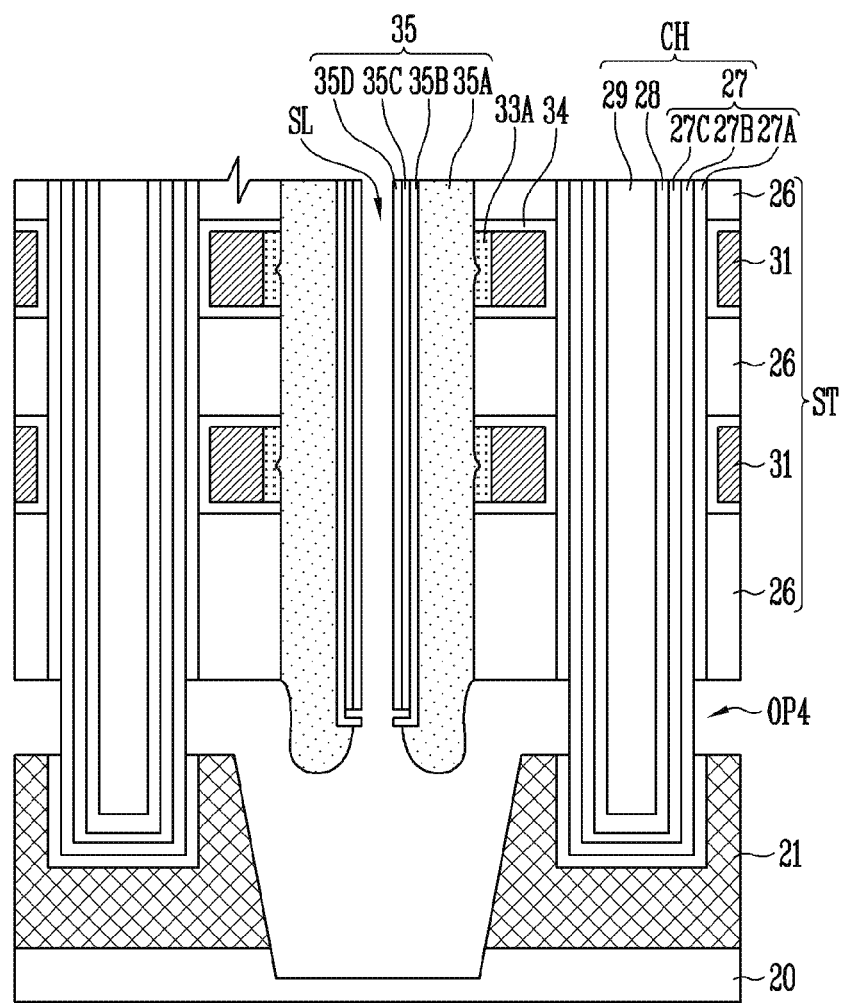
Figure 2J:
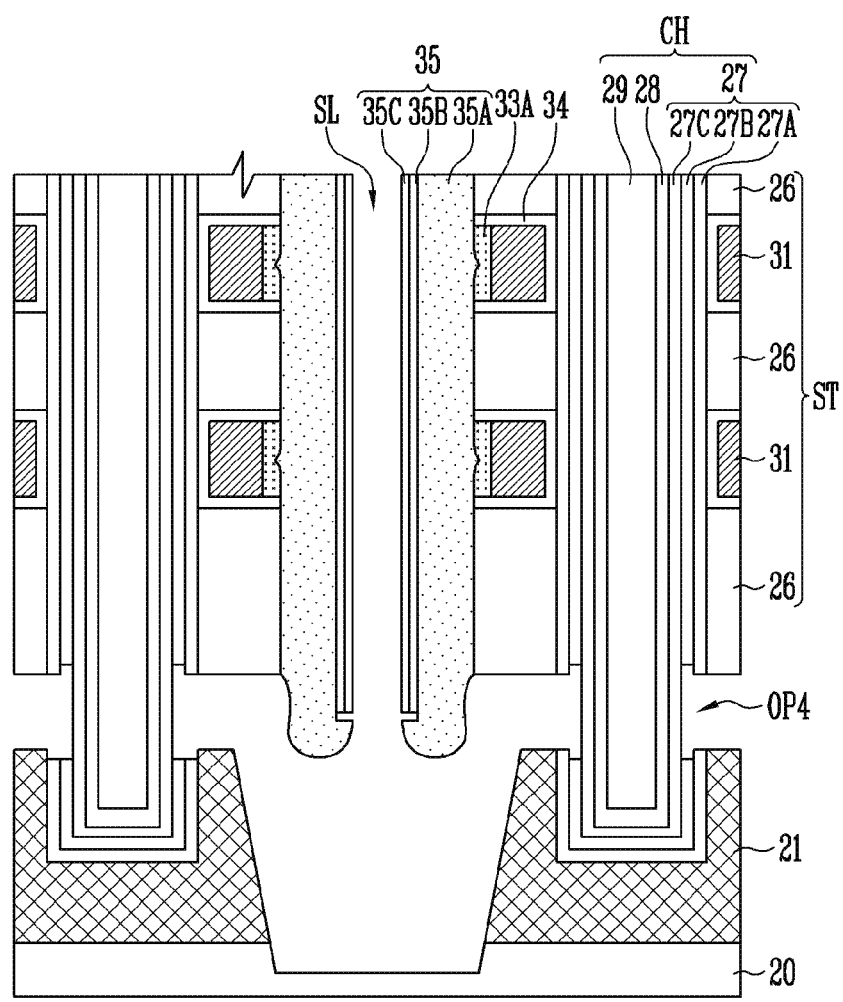
Figure 2K:
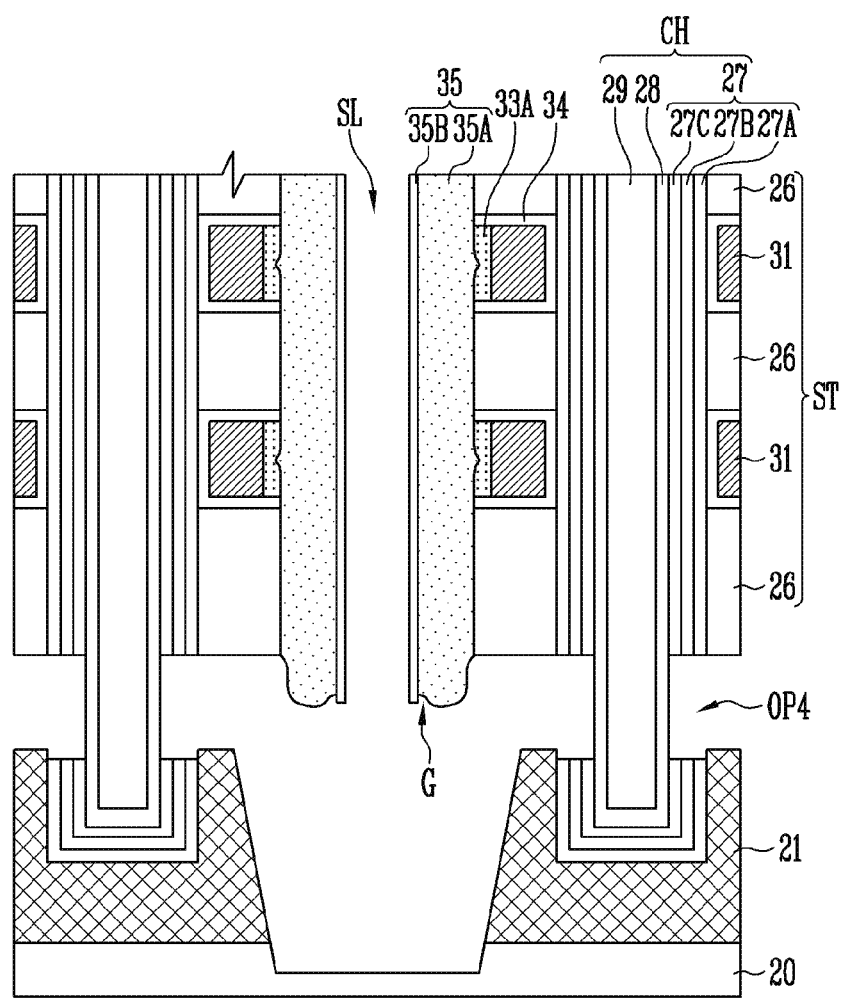

Referring to FIGS. 2I to 2K, the memory layer 27 is partially etched through the fourth opening OP4 to expose the channel layer 28. In the process of etching the memory layer 27, at least one of the first sacrificial layer 23, the protective layer 32, the spacer 35, and the lowermost second material layer 26 may be etched together.

A process of etching the memory layer 27 is described as follows. First, referring to FIG. 2I, the charge blocking layer 27A is etched. The charge blocking layer 27A may be etched using a dry cleaning process. At this time, at least some of the first spacer 35A, the third spacer 35C, the first sacrificial layer 23, and the lowermost second material layer 26 may be etched. The first sacrificial layer 23 may be etched and the base 20 and the first source layer 21 may be exposed. Subsequently, referring to FIG. 2J, the data storage layer 27B is etched. The data storage layer 27B may be etched using a dip out process using phosphoric acid. At this time, at least some of the fourth spacer 35D and the second spacer 35B may be etched. The fourth spacer 35D exposed through the slit SL may be completely removed. Subsequently, referring to FIG. 2K, the tunnel insulating layer 27C is etched. The tunnel insulating layer 27C may be etched by using a dry cleaning process. At this time, at least some of the first spacer 35A, the third spacer 35C, and the lowermost second material layer 26 may be etched. The third spacer 35C exposed through the slit SL may be completely removed. In addition, the groove G may be formed between the first spacer 35A and the second spacer 35B.

Figure 2L:
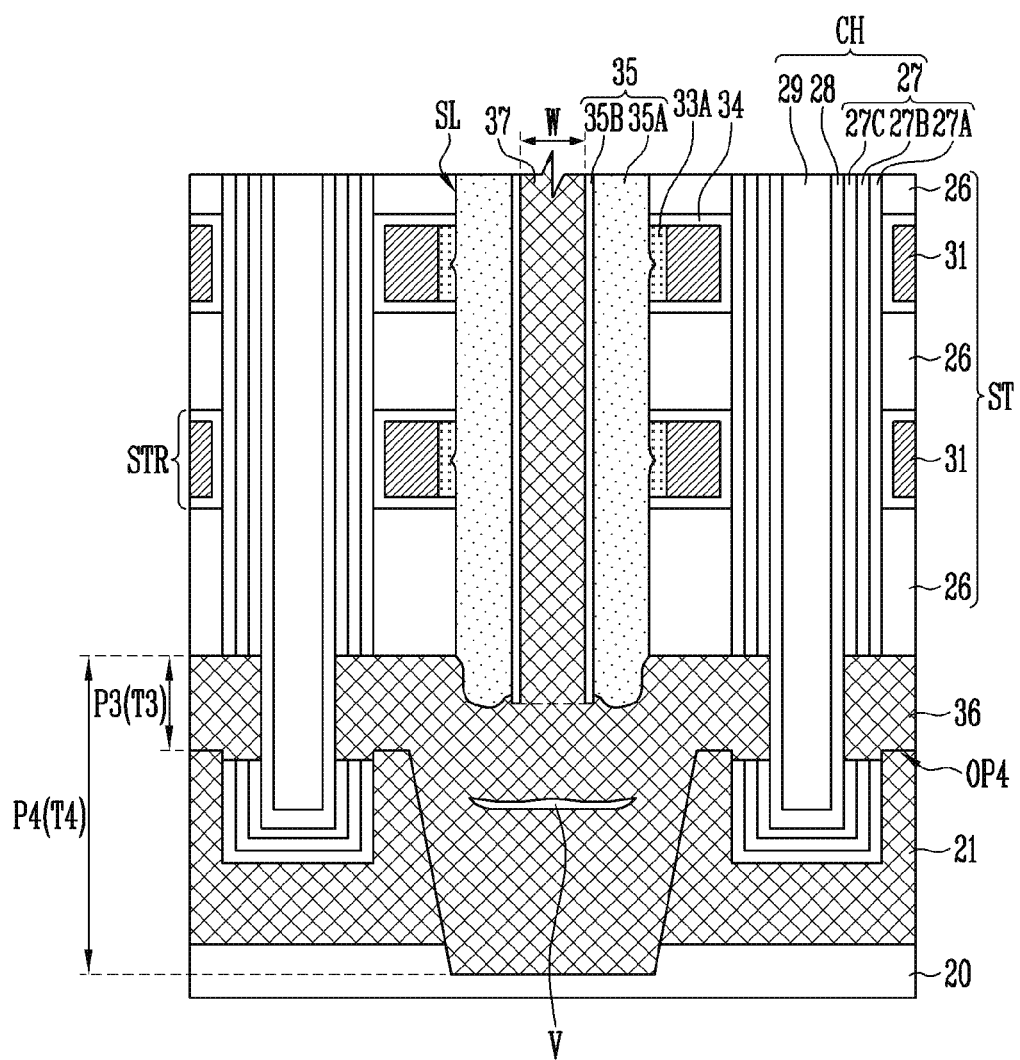

Referring to FIG. 2L, a second source layer 36 positioned in the fourth opening OP4 and a source contact structure 37 positioned in the slit SL are formed. The second source layer 36 and the source contact structure 37 may be a single layer. For example, a conductive layer is deposited in the fourth opening OP4 and the slit SL to form the second source layer 36 and the source contact structure 37. The conductive layer may include a polysilicon layer, a metal layer, or the like. The second source layer 36 and the source contact structure 37 may include a dopant.

The third portion P3 has a thickness T3 thinner than the thickness T4 of the fourth portion P4. In addition, the thickness T3 of the third portion P3 may be equal to an opened width W of the slit SL or may have a value smaller than the width W. Therefore, the third portion P3 may be readily filled with the conductive material without the void V by depositing the conductive material along a profile of the fourth opening P4 and the slit SL. Because the third portion P3 does not include the void V, agglomeration of the polysilicon or an electrical isolation between the channel structures CH and the second source layer 36 in a subsequent heat treatment process may be mitigated or prevented.

The fourth portion P4 may or may not include the void V. For example, when the slit SL is filled with the conductive material before the fourth portion P4 is completely filled with the conductive material, the void V may be formed in the fourth portion P4. Alternatively, the fourth portion P4 may be filled with the conductive material without the void V, by removing the conductive material formed in the slit SL, and then forming the conductive material again in the fourth portion P4 and the slit SL.

Subsequently, the heat treatment process may be performed. The dopant in the first source layer 21 or the second source layer 36 may be diffused to the channel structure CH by the heat treatment process. The dopant may be diffused to the channel layer 28 by the heat treatment process. Here, the region in which the dopant is diffused may be used as a junction of a select transistor STR.

According to the above-described manufacturing method, the second source layer 36 may be formed using the sacrificial layer 24 having different thicknesses according to the region. Therefore, a connection method of the channel structure CH and the second source layer 36 may be simplified, and process stability may be improved.

Figure 3:
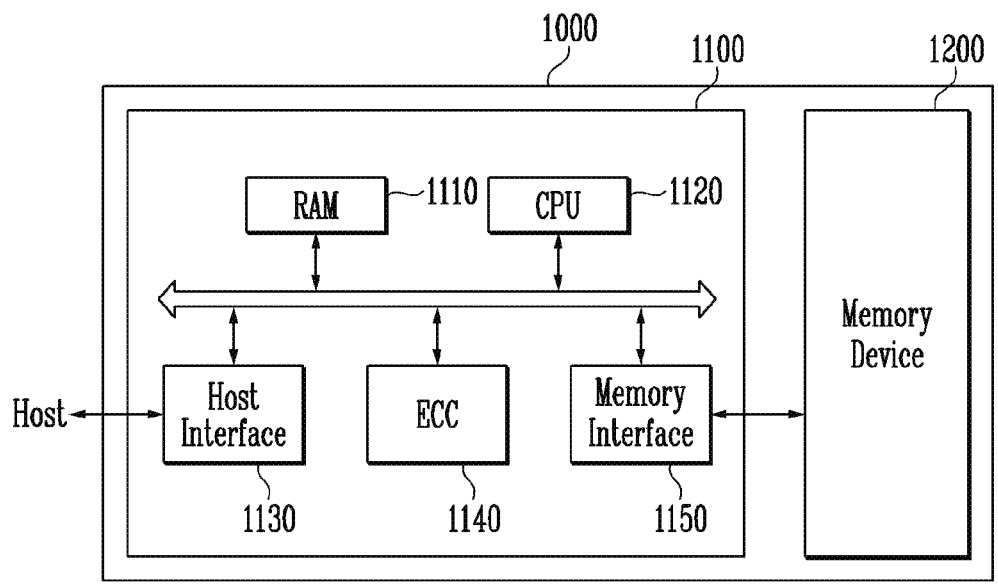
FIG. 3 is a block diagram illustrating a configuration of a memory system according to an embodiment of the present disclosure.

FIG. 3 is a block diagram illustrating a configuration of a memory system 1000 according to an embodiment of the present disclosure.

Referring to FIG. 3, the memory system 1000 includes a memory device 1200 and a controller 1100.

The memory device 1200 is used to store data information having various data types such as text, graphics, software code, and the like. The memory device 1200 may be a non-volatile memory. In addition, the memory device 1200 may have the structure described above with reference to FIGS. 1A to 2L, and may be manufactured according to the manufacturing method described above with reference to FIGS. 1A to 2L. As an embodiment, the memory device 1200 may include a first source layer including a first portion and a second portion having a thickness thicker than a thickness of the first portion, bit lines, a stack positioned between the first source layer and the bit lines, and including conductive layers and insulating layers which are alternately stacked, a channel structure passing through the stack and extending to the first portion, and a slit passing through the stack and extending to the second portion. Because the structure of the memory device 1200 and the method of manufacturing the memory device 1200 are the same as described above, a detailed description thereof is not repeated here.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 includes a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include a ROM that stores code data for interfacing with the host.

As described above, because the memory system 1000 according to an embodiment of the present disclosure includes the memory device 1200 having an improved degree of integration and an improved characteristic, a degree of integration and a characteristic of the memory system 1000 may also be improved.

Figure 4:
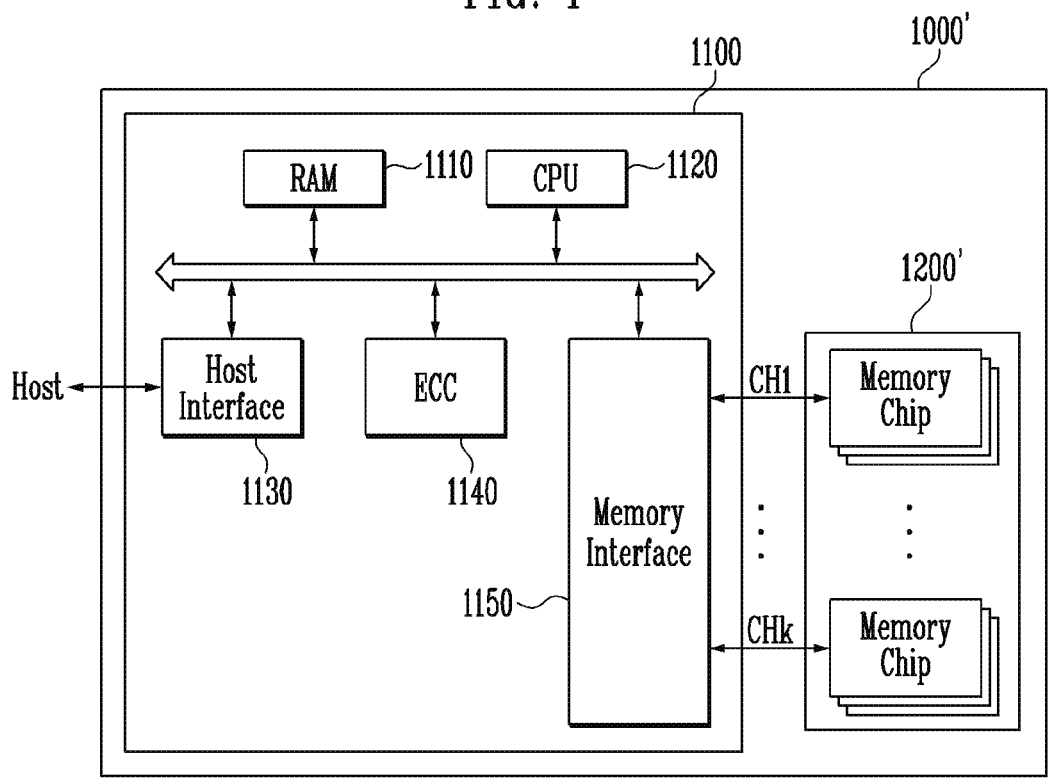
FIG. 4 is a block diagram illustrating a configuration of a memory system according to an embodiment of the present disclosure.

FIG. 4 is a block diagram illustrating a configuration of a memory system 1000' according to an embodiment of the present disclosure. Hereinafter, descriptions that repetitive to the above description are omitted.

Referring to FIG. 4, the memory system 1000' includes a memory device 1200' and a controller 1100. In addition, the controller 1100 includes a RAM 1110, a CPU 1120, a host interface 1130, an ECC circuit 1140, a memory interface 1150, and the like.

The memory device 1200' may be a non-volatile memory. In addition, the memory device 1200' may have the structure described above with reference to FIGS. 1A to 2L, and may be manufactured according to the manufacturing method described above with reference to FIGS. 1A to 2L. As an embodiment, the memory device 1200' may include a first source layer including a first portion and a second portion having a thickness thicker than a thickness of the first portion, bit lines, a stack positioned between the first source layer and the bit lines, and including conductive layers and insulating layers which are alternately stacked, a channel structure passing through the stack and extending to the first portion, and a slit passing through the stack and extending to the second portion. Because the structure of the memory device 1200' and the method of manufacturing the memory device 1200' are the same as described above, a detailed description thereof is not repeated here.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, because the memory system 1000' according to an embodiment of the present disclosure includes the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 5:
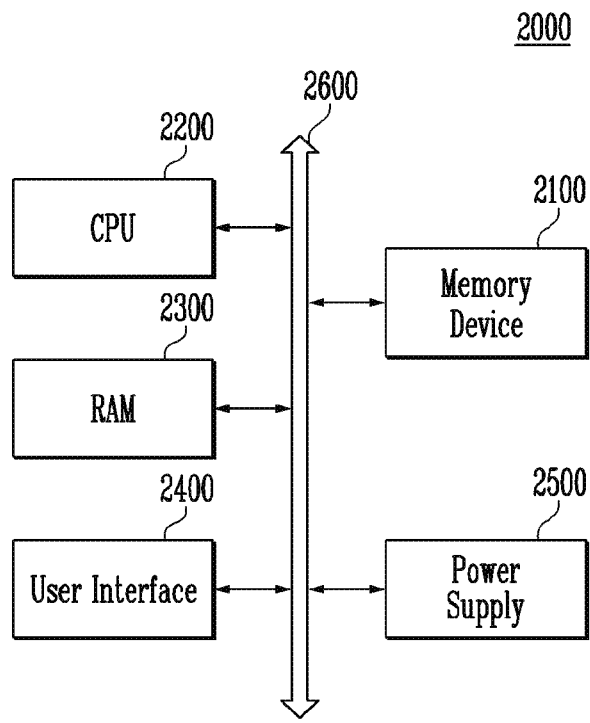
FIG. 5 is a block diagram illustrating a configuration of a computing system according to an embodiment of the present disclosure.

FIG. 5 is a block diagram illustrating a configuration of a computing system 2000 according to an embodiment of the present disclosure. Hereinafter, descriptions that repetitive to the above description are omitted.

Referring to FIG. 5, the computing system 2000 includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a non-volatile memory. In addition, the memory device 2100 may have the structure described above with reference to FIGS. 1A to 2L, and may be manufactured according to the manufacturing method described above with reference to FIGS. 1A to 2L. As an embodiment, the memory device 2100 may include a first source layer including a first portion and a second portion having a thickness thicker than a thickness of the first portion, bit lines, a stack positioned between the first source layer and the bit lines, and including conductive layers and insulating layers which are alternately stacked, a channel structure passing through the stack and extending to the first portion, and a slit passing through the stack and extending to the second portion. Because the structure of the memory device 2100 and the method of manufacturing the memory device 2100 are the same as described above, a detailed description thereof is not repeated here.

In addition, the memory device 2100 may be a multi-chip package including a plurality of memory chips as described with reference to FIG. 4.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, because the computing system 2000 according to an embodiment of the present disclosure includes the memory device 2100 having an improved degree of integration and an improved characteristic, a characteristic of the computing system 2000 may also be improved.

Figure 6:
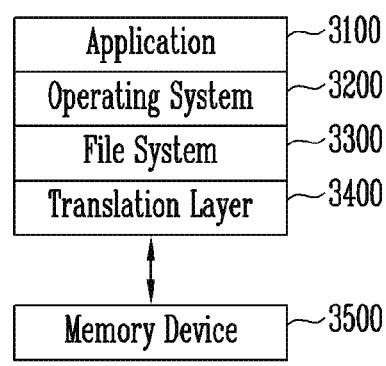
FIG. 6 is a block diagram illustrating a computing system according to an embodiment of the present disclosure.

FIG. 6 is a block diagram illustrating a computing system 3000 according to an embodiment of the present disclosure.

Referring to FIG. 6, the computing system 3000 includes a software layer including an operating system 3200, an application 3100, a file system 3300, a translation layer 3400, and the like. In addition, the computing system 3000 includes a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is the Windows operating system from Microsoft Corporation, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are illustrated as separate blocks in FIG. 3, the application 3100 and the file system 3300 may be included in the operating system 3200.

The translation layer 3400 translates an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. In addition, the memory device 3500 may have the structure described above with reference to FIGS. 1A to 2L, and may be manufactured according to the manufacturing method described above with reference to FIGS. 1A to 2L. As an embodiment, the memory device 3500 may include a first source layer including a first portion and a second portion having a thickness thicker than a thickness of the first portion, bit lines, a stack positioned between the first source layer and the bit lines, and including conductive layers and insulating layers which are alternately stacked, a channel structure passing through the stack and extending to the first portion, and a slit passing through the stack and extending to the second portion. Because the structure of the memory device 3500 and the method of manufacturing the memory device 3500 are the same as described above, a detailed description thereof is not repeated here.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operating memory of the computing system 3000. In addition, the translation layer 3400 may be included in the operating system layer or in the controller layer.

As described above, because the computing system 3000 according to an embodiment of the present disclosure includes the memory device 3500 having an improved degree of integration and an improved characteristic, a characteristic of the computing system 3000 may also be improved.

Although the technical spirit of the present disclosure has been specifically described according to presented embodiments, it should be noted that the above-described embodiments are for the purpose of description and not of limitation. In addition, those skilled in the art will understand that various embodiments are possible within the scope of the technical spirit of the present disclosure.

What is claimed is:

1. A method of manufacturing a semiconductor device, the method comprising:
    forming a first sacrificial layer comprising a first portion and a second portion having a thickness thicker than a thickness of the first portion;
    forming a stack comprising first material layers and second material layers alternating with each other on the first sacrificial layer;
    forming a channel structure passing through the stack and extending to the first portion;
    forming a slit passing through the stack and extending to the second portion;
    removing the first sacrificial layer through the slit to form a first opening; and
    forming a second source layer connected to the channel structure in the first opening.

2. The method of claim 1, further comprising:
    forming a first source layer comprising a second opening before forming the first sacrificial layer.

3. The method of claim 2, wherein the first sacrificial layer is formed on the first source layer, and the second portion is formed in the second opening.

4. The method of claim 2, further comprising:
    forming a second sacrificial layer on the first source layer before forming the first sacrificial layer.

5. The method of claim 4, wherein the first sacrificial layer comprises polysilicon, and the second sacrificial layer comprises an oxide layer.

6. The method of claim 1, further comprising:
    removing the first material layers through the slit to form third openings;
    forming third material layers in the third openings, respectively; and
    forming sealing layers in the third openings, respectively.

7. The method of claim 1, further comprising:
    replacing the first material layers with third material layers through the slit before forming the first opening.

8. The method of claim 1, further comprising:
    forming a spacer in the slit before forming the first opening.

9. The method of claim 1, wherein the channel structure comprises a channel layer and a memory layer surrounding the channel layer.

10. The method of claim 9, further comprising:
    partially removing the memory layer through the first opening before forming the second source layer.

11. The method of claim 1, further comprising:
    performing a heat treatment process after forming the second source layer.

12. The method of claim 11, wherein dopant in the first source layer or the second source layer is diffused to the channel structure by the heat treatment process.

13. A method of manufacturing a semiconductor device, the method comprising:
    forming a first source layer;
    forming a first opening in the first source layer;
    forming, on the first source layer, a first sacrificial layer comprising a first portion and a second portion, wherein the second portion is formed in the first opening;
    forming a stack comprising sacrificial layers and insulating layers alternating with each other on the first sacrificial layer;
    forming a channel structure passing through the stack and having a bottom surface positioned in the first source layer;
    forming a slit passing through the stack and having a bottom surface positioned in the second portion;
    removing the first sacrificial layer through the slit to form a second opening; and
    forming a second source layer connected to the channel structure in the second opening.

14. The method of claim 13, wherein the first portion has a thickness thinner than a thickness of the second portion.

15. The method of claim 13, further comprising:
    replacing the sacrificial layers with conductive layers through the slit before forming the second opening.

16. The method of claim 15, further comprising:
    forming sealing layers on the conductive layers, respectively.

* * * * *